(12) United States Patent
Lai et al.

(10) Patent No.: US 11,935,859 B2
(45) Date of Patent: *Mar. 19, 2024

(54) CHIP STRUCTURE AND MANUFACTURING METHOD THEREOF

(71) Applicant: XINTEC INC., Taoyuan (TW)

(72) Inventors: Jiun-Yen Lai, Taoyuan (TW); Chia-Hsiang Chen, Hsinchu (TW)

(73) Assignee: XINTEC INC., Taoyuan (TW)

( * ) Notice: Subject to any disclaimer, the term of this patent is extended or adjusted under 35 U.S.C. 154(b) by 212 days.

This patent is subject to a terminal disclaimer.

(21) Appl. No.: 17/588,185

(22) Filed: Jan. 28, 2022

(65) Prior Publication Data

US 2022/0157762 A1    May 19, 2022

Related U.S. Application Data

(63) Continuation of application No. 16/941,486, filed on Jul. 28, 2020, now Pat. No. 11,309,271.

(60) Provisional application No. 62/879,969, filed on Jul. 29, 2019.

(51) Int. Cl.
*H01L 23/00* (2006.01)
*H01L 23/48* (2006.01)

(52) U.S. Cl.
CPC .......... *H01L 24/29* (2013.01); *H01L 23/481* (2013.01); *H01L 24/05* (2013.01); *H01L 24/19* (2013.01); *H01L 24/20* (2013.01); *H01L 24/27* (2013.01); *H01L 2224/29026* (2013.01)

(58) Field of Classification Search
CPC ........ H01L 24/29; H01L 23/481; H01L 24/27
See application file for complete search history.

(56) References Cited

U.S. PATENT DOCUMENTS

| | | | |
|---|---|---|---|
| 7,292,055 B2 * | 11/2007 | Egitto | H05K 3/4007 |
| | | | 324/754.18 |
| 9,799,778 B2 | 10/2017 | Kuo et al. | |
| 10,152,180 B2 | 12/2018 | Chang et al. | |
| 10,573,591 B2 * | 2/2020 | Tsujita | H01L 27/14618 |
| 11,309,271 B2 * | 4/2022 | Lai | H01L 24/29 |
| 2011/0079903 A1 | 4/2011 | Liu | |
| 2013/0043570 A1 | 2/2013 | Lin et al. | |
| 2015/0230333 A1 | 8/2015 | Yoda et al. | |
| 2017/0207194 A1 | 7/2017 | Shen et al. | |

* cited by examiner

*Primary Examiner* — Dale E Page
*Assistant Examiner* — Ilner Jean Baptiste
(74) *Attorney, Agent, or Firm* — LIU & LIU

(57) ABSTRACT

A chip structure includes a first substrate, a second substrate, a conductive via, and a redistribution layer. The first substrate has a first inclined sidewall. The second substrate is located on a bottom surface of the first substrate, and has an upper portion and a lower portion. The lower portion extends from the upper portion. The upper portion is between the first substrate and the lower portion. The upper portion has a second inclined sidewall, and a slope of the first inclined sidewall is substantially equal to a slope of the second inclined sidewall. The conductive via is in the lower portion. The redistribution layer extends from a top surface of the first substrate to a top surface of the lower portion of the second substrate sequentially along the first inclined sidewall and the second inclined sidewall, and is electrically connected to the conductive via.

19 Claims, 9 Drawing Sheets

CHIP STRUCTURE AND MANUFACTURING METHOD THEREOF

RELATED APPLICATION

This application is a continuation application of U.S. patent application Ser. No. 16/941,486, filed Jul. 28, 2020, which claims priority to U.S. Provisional Application Ser. No. 62/879,969, filed Jul. 29, 2019, which are herein incorporated by reference in their entirety.

BACKGROUND

Field of Invention

The present invention relates to a chip structure and a manufacturing method of the chip structure.

Description of Related Art

A chip structure may have stacked chips. The upper surface and the lower surface of the chip structure may need to be electrically connected to other devices. Therefore, through holes may be formed in the top surface and the bottom surface of the chip structure to expose conductive pads, and redistribution layers electrically connected to the conductive pads can be respectively formed on the upper surface and the lower surface of the chip structure so that other devices can be electrically connected to the redistribution layers in a subsequent process. The upper surface of the chip structure is the upper surface of an upper chip, and the lower surface of the chip structure is the lower surface of a lower chip. In addition, the conductive pad of the upper chip is located on the lower surface of the upper chip, and the conductive pad of the lower chip is located on the upper surface of the lower layer chip. The conductive pads of different chips can be connected in a bonding process.

However, the aspect ratio of the through hole is related to the thickness of the chip. When a thick chip is used, the aspect ratio of the through hole is large (e.g., larger than 2), and thus a bending portion of the redistribution layer is easily damaged. As a result, the thickness of the chip of the chip structure is limited and it is difficult to design. Although a large aspect ratio through hole can be made by laser drilling, the conductive pad is easily damaged by laser drilling.

SUMMARY

An aspect of the present invention is to provide a chip structure.

According to an embodiment of the present invention, a chip structure includes a first substrate, a second substrate, a conductive via, and a redistribution layer. The first substrate has a first inclined sidewall, a conductive pad, and a redistribution layer. The second substrate is located on the top surface of the first substrate and has an upper portion and a lower portion. The lower portion extends from the upper portion. The upper portion is located between the first substrate and the lower portion. The upper portion has a second inclined sidewall, and a slope of the first inclined sidewall is substantially equal to the slope of the second inclined sidewall. The conductive via is located in the lower portion. The redistribution layer extends from the top surface of the first substrate sequentially along the first inclined sidewall and the second inclined sidewall to the top surface of the lower portion of the second substrate and is electrically connected to the conductive via.

In an embodiment of the present invention, the chip structure further includes a bonding layer. The bonding layer is located between the first substrate and the second substrate, and a lateral surface of bonding layer is in contact with the redistribution layer.

In an embodiment of the present invention, the first substrate, second substrate, and bonding layer define a cavity.

In an embodiment of the present invention, the bonding layer has an inclined lateral surface. The chip structure further includes an isolation layer between the conductive via and the second substrate, on a bottom surface of the second substrate, between the redistribution layer and the first substrate, on the first inclined sidewall, on the inclined lateral surface of the bonding layer, and on the second inclined sidewall.

In an embodiment of the present invention, the bonding layer has an inclined lateral surface. The surface protecting layer is located on the top surface, the redistribution layer, the inclined lateral surface, the second inclined sidewall, and the upper portion of the second substrate.

In an embodiment of the present invention, the first substrate has a conductive pad and the sidewall of conductive pad is contact with the redistribution layer.

In an embodiment of the present invention, the chip structure further includes a bonding layer. The bonding layer is located between the first substrate and the second substrate, and the conductive pad of the first substrate is located on the bonding layer.

In an embodiment of the present invention, the second substrate has a conductive pad, and the conductive pad is contact with the distribution layer.

In an embodiment of the present invention, the chip structure further includes a bonding layer. The bonding layer is located between the first substrate and the second substrate, and on the conductive pad of the second substrate.

In an embodiment of the present invention, the first substrate and second substrate each has a conductive pad, and the chip structure further includes a bonding layer. The bonding layer is located among the two conductive pads and the redistribution layer.

In an embodiment of the present invention, the redistribution layer is stepped.

In an embodiment of the present invention, the redistribution layer has two horizontal portions and an inclined portion. Two ends of the inclined portion are respectively connected to horizontal portions.

In an embodiment of the present invention, the two horizontal portions of the redistribution layer are respectively located on the top surface of the first substrate and the top surface of the lower portion, and the inclined portion is located on the first inclined sidewall and the second inclined sidewall.

In an embodiment of the present invention, the horizontal portion on the top surface of the lower portion is in contact with the top surface of the conductive via.

An aspect of the present invention is to provide a manufacturing method of a chip structure.

According to an embodiment of the present invention, the manufacturing method of a chip structure includes bonding a first substrate to a second substrate, forming an opening in the second substrate, forming a conductive via in the opening of the second substrate, forming a trench in the first substrate and the second substrate such that the conductive via is exposed through the trench, wherein the first substrate has a first inclined sidewall, and the second substrate has a second inclined sidewall, and a slope of the first inclined sidewall is substantially equal to a slope of the second inclined sidewall, and forming a redistribution layer that extends from a top surface of the first substrate to a top surface of the lower portion of the second substrate sequentially along the first inclined sidewall and the second inclined sidewall, and is electrically connected to the conductive via.

In an embodiment of the present invention, the conductive via is formed by electroplating or electroless plating.

In an embodiment of the present invention, the manufacturing method of a chip structure further includes after forming the conductive via, bonding the second substrate to a carrier.

In an embodiment of the present invention, the manufacturing method of a chip structure further includes after forming the redistribution layer, removing the carrier from the second substrate.

In an embodiment of the present invention, the trench is formed by cutting the first substrate and the second substrate with a cutting tool.

In an embodiment of the present invention, the manufacturing method of a chip structure further includes after forming the redistribution layer, cutting the second substrate along the trench, wherein a shape of a sidewall of the second substrate is upright or stepped based on a cutting depth of the second substrate.

In the embodiments of the present invention, since the trench can be formed in the first substrate and the second substrate after the first substrate is bonded to the second substrate, the conductive via in the lower portion of the second substrate can be exposed through the trench, and the first inclined sidewall of the first substrate and the second inclined sidewall of the second substrate can be concurrently formed through the formation of the trench. As a result, the redistribution layer subsequently formed may extend from the top surface of the first substrate to the top surface of the lower portion of the second substrate sequentially along the first inclined sidewall and the second inclined sidewall, and is electrically connected to the conductive via. The conductive via of the chip structure in this disclosure is only located in the lower portion of the second substrate and the aspect ratio of the conductive via can be reduced effectively. Moreover, the redistribution layer extends along the first inclined sidewall and the second inclined sidewall, and thus the thickness of the first substrate and the thickness of the second substrate do not affect the aspect ratio, and this also benefits design.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
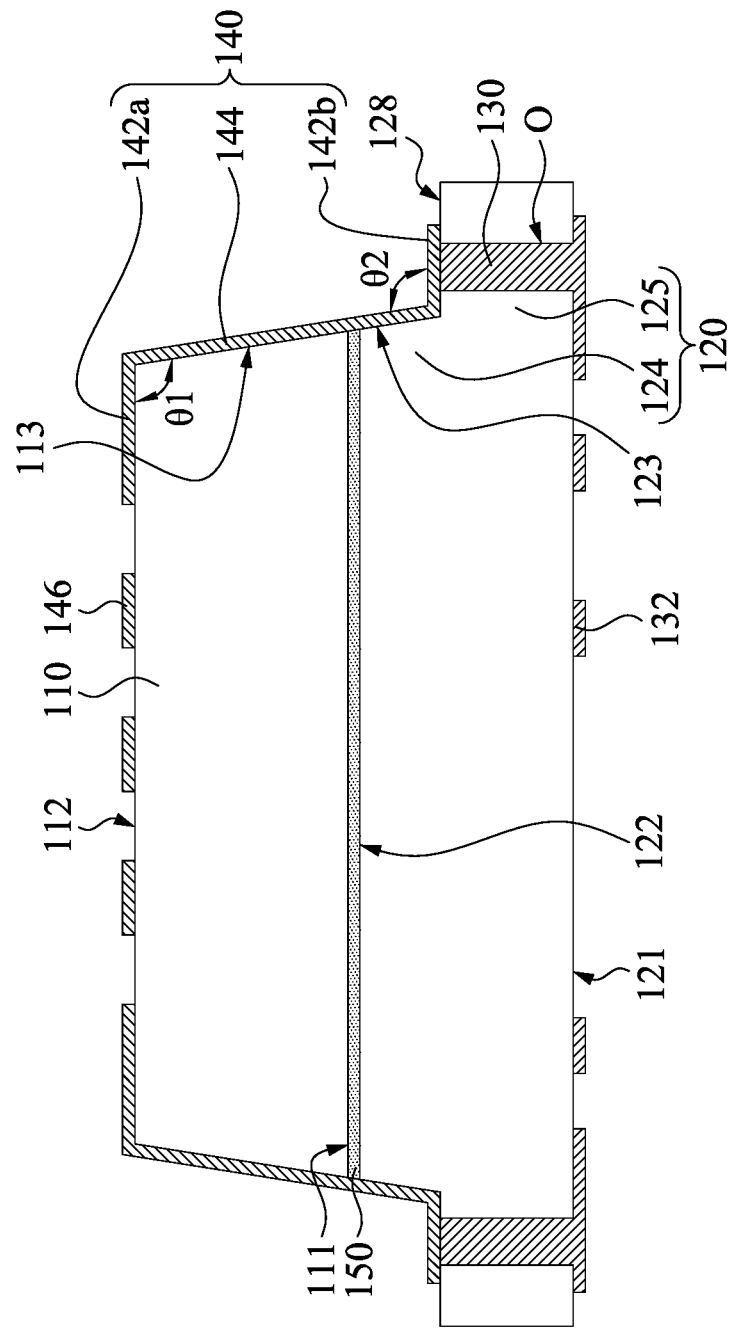
FIG. 1 is a cross-sectional view of a chip structure according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a chip structure 100 according to one embodiment of the present invention. The chip structure 100 includes a first substrate 110, a second substrate 120, a conductive via 130, and a redistribution layer 140. The first substrate 110 has a bottom surface 111 and a top surface 112 that is opposite the bottom surface 111, and has a first inclined sidewall 113 that is adjacent to the bottom surface 111 and the top surface 112. The second substrate 120 is located on the bottom surface 111 of the first substrate 110, and has an upper portion 124 and a lower portion 125. The lower portion 125 of the second substrate 120 extends from the upper portion 124, and a width of the lower portion 125 is greater than a width of the upper portion 124. The upper portion 124 of the second substrate 120 is located between the first substrate 110 and the lower portion 125 of the second substrate 120. The upper portion 124 of the second substrate 120 has a second inclined sidewall 123, and a slope of the first inclined sidewall 113 is substantially equal to a slope of the second inclined sidewall 123.

The conductive via 130 is located in the lower portion 125 of the second substrate 120. The redistribution layer 140 extends from the top surface 112 of the first substrate 110 to a top surface 128 of the lower portion 125 of the second substrate 120 sequentially along the first inclined sidewall 113 to the second inclined sidewall 123, and is electrically connected to the conductive via 130.

In this embodiment, the first substrate 110 and the second substrate 120 may be made of a material including silicon, and may have a sensor or an internal circuit. The conductive via 130 may be made of a material including copper, and may be formed by electroplating or electroless plating (including sputtering a seed layer and an exposure process for circuit design). The redistribution layer 140 may contain aluminum or copper and can be formed by sputtering. In addition, the redistribution layer 140 may contain a bonding pad portion 146 on the top surface 112 of the first substrate 110. The chip structure 100 may contain a bonding pad portion 132 on a bottom surface 121 of the second substrate 120. The bonding pad portion 132 and the bonding pad portion 146 may be used for disposing a conductive structure (e.g., a tin ball) or may be electrically connected to other electrical devices (e.g., a printed circuit board and/or a chip), and through such a configuration, an advantage of the chip structure 100 is that electrical connection on both sides thereof is possible.

Since the redistribution layer 140 of the chip structure 100 may extend from the top surface 112 of the first substrate 110 to the top surface 128 of the lower portion 125 of the second substrate 120, and then electrically connect to the conductive via 130, the redistribution layer 140 will not be affected by the aspect ratio of a through hole, as in the case of conventional configurations. The conductive via 130 of the chip structure 100 of this disclosure is only located in the lower portion 125 of the second substrate 120, and the aspect ratio can be lowered effectively. Moreover, the redistribution layer 140 extends from the first inclined sidewall 113 and the second inclined sidewall 123, such that the thickness of the first substrate 110 and the thickness of the second substrate 120 do not affect the aspect ratio, and this also benefits design. For example, a thicker first substrate 110 and second substrate 120 can be chosen by designers to prevent disconnection of the redistribution layer 140.

In this embodiment, the redistribution layer 140 is stepped. More specifically, the redistribution layer 140 has two horizontal portions 142a, 142b and an inclined portion 144, and two ends of the inclined portion 144 are respectively connected to the two horizontal portions 142a, 142b. An obtuse angle θ1 is formed between the inclined portion 144 and the horizontal portion 142a, and an obtuse angle θ2 is formed between the inclined portion 144 and the horizontal portion 142b. Similarly, an obtuse angle θ1 is formed between the top surface 112 of the first substrate 110 and the first inclined sidewall 113, and an obtuse angle θ2 is formed between the second inclined sidewall 123 of the second substrate 120 and the top surface 128 of the lower portion 125.

The two horizontal portions 142a, 142b are respectively located on the top surface 112 of the first substrate 110 and the top surface 128 of the lower portion 125. The horizontal portion 142b on the top surface 128 of the lower portion 125 of the second substrate 120 is connected to the top surface of the conductive via 130.

In this embodiment, the chip structure 100 further includes a bonding layer 150. The bonding layer 150 is located between the bottom surface 111 of the first substrate 110 and a top surface 122 of the second substrate 120, and the lateral surface of the bonding layer 150 is in contact with the redistribution layer 140.

It is to be noted that the connection relationship of the aforementioned elements will not be repeated. In the following description, other types of chip structures will be described.

Figure 2:
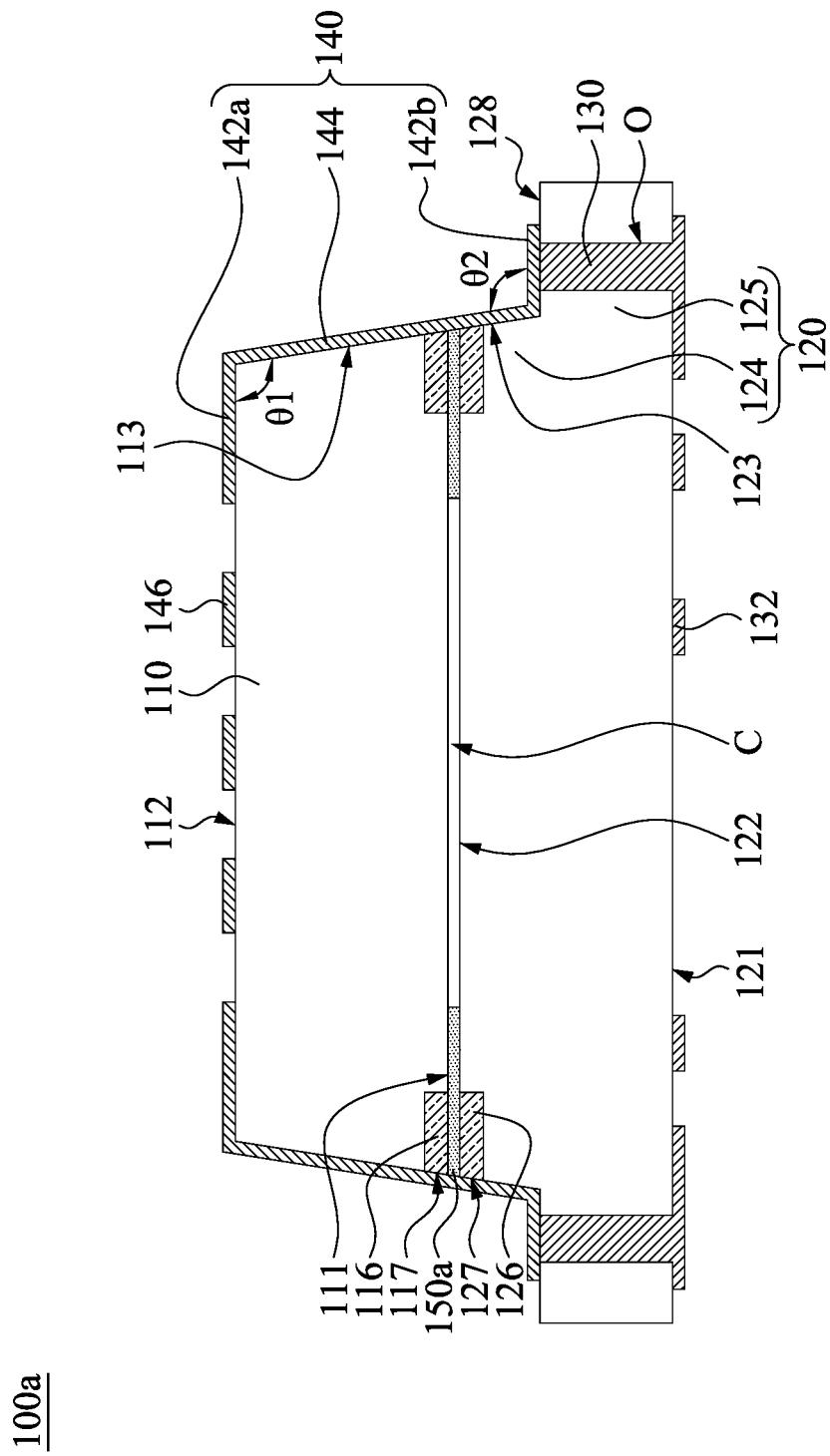
FIG. 2 is a cross-sectional view of a chip structure according to one embodiment of the present invention.

FIG. 2 is a cross-sectional view of a chip structure 100a according to one embodiment of the present invention. The chip structure 100a includes the first substrate 110, the second substrate 120, the conductive via 130, the redistribution layer 140, and the bonding layer 150a. The difference between this embodiment and the embodiment shown in FIG. 1 is that the first substrate 110, the second substrate 120 and the bonding layer 150a define a cavity C, and the first substrate 110 has a conductive pad 116, and the second substrate 120 has a conductive pad 126. A sidewall 117 of the conductive pad 116 and a sidewall 127 of the conductive pad 126 are in contact with the redistribution layer 140. In addition, the conductive pad 116 of the first substrate 110 is located on the bonding layer 150a, and the bonding layer 150a is located on the conductive pad 126. Therefore, the bonding layer 150a is located among two conductive pads 116, 126 and the redistribution layer 140.

In this embodiment, the conductive pad 116 of the first substrate 110 and the conductive pad 126 of the second substrate 120 may be electrically connected through the redistribution layer 140, so that it may be possible for the bonding layer 150a to be made of a non-conductive material(s). This not only lowers costs, but also allows for more flexibility in the choice of materials.

A manufacturing method of the chip structure 100 of FIG. 1 will now be described.

Figure 3:
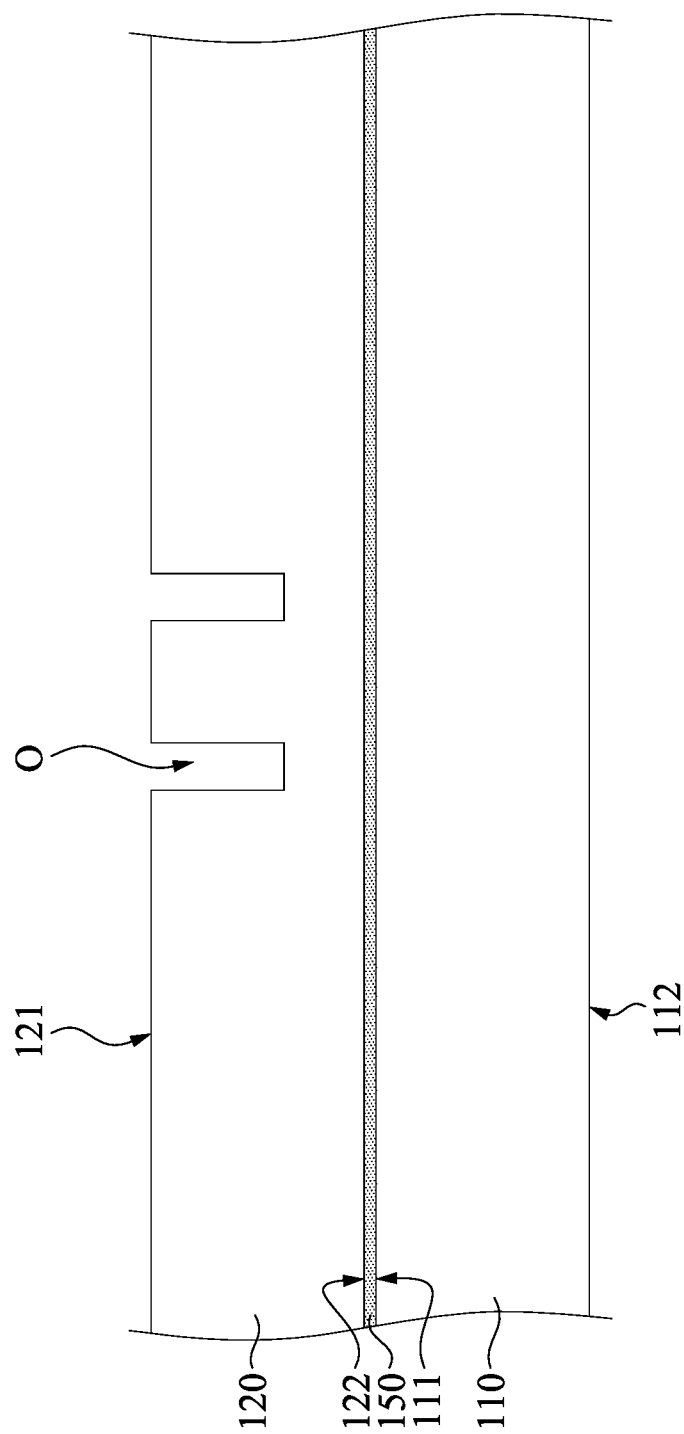
FIG. 3 is a cross-sectional view of a second substrate after bonding to a first substrate according to one embodiment of the present invention.
Figure 4:
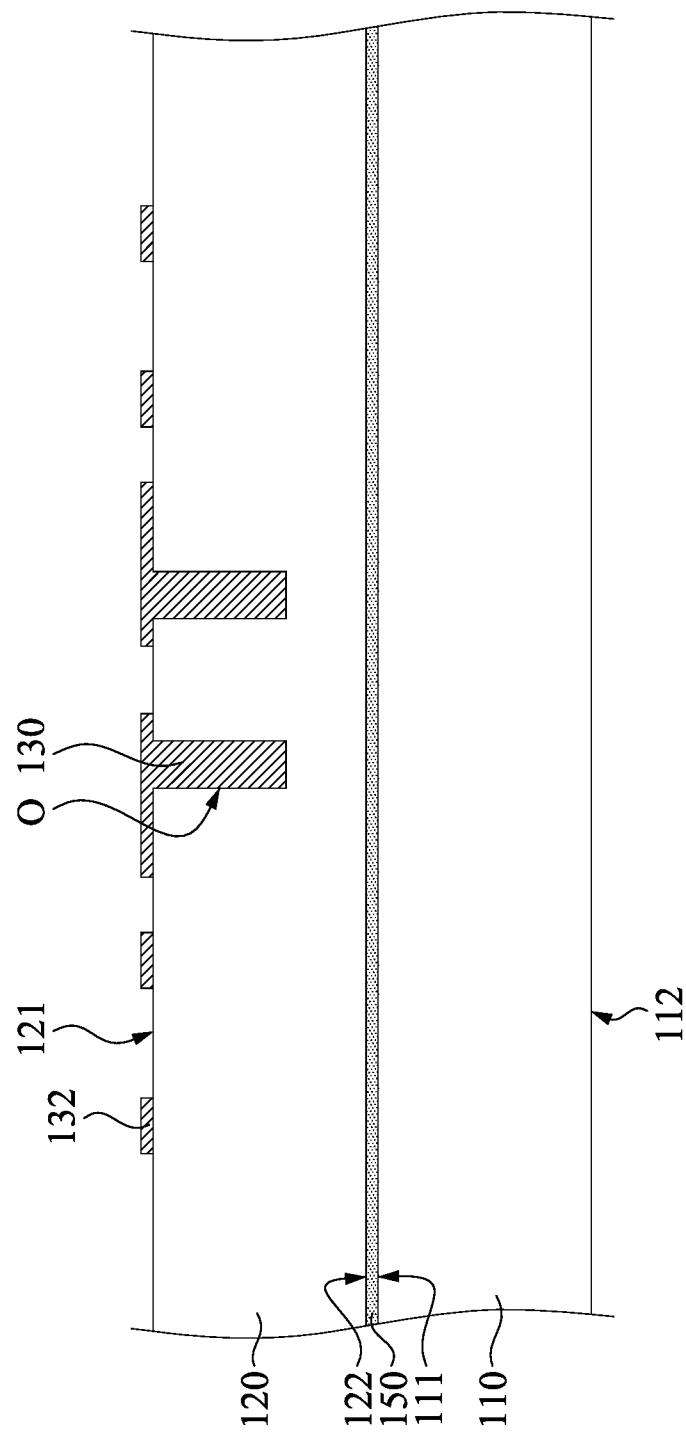
FIG. 4 is a cross-sectional view of the second substrate shown in FIG. 3 after forming a conductive via.

FIG. 3 is a cross-sectional view of the second substrate 120 after bonding to the first substrate 110 according to an embodiment of the present invention. FIG. 4 is a cross-sectional view of the second substrate 120 of FIG. 3 after forming the conductive via 130. As shown in FIG. 3 and FIG. 4, first of all, the bonding layer 150 may be used to bond the second substrate 120 to the first substrate 110, such that the bonding layer 150 is located between the first substrate 110 and the second substrate 120. Thereafter, an opening O can be formed in the second substrate 120. After forming the opening O, the conductive via 130 may be formed in the opening O of the second substrate 120 by electroplating, and the bonding pad portion 132 may be formed on the second substrate 120, as shown in FIG. 4.

Figure 5:
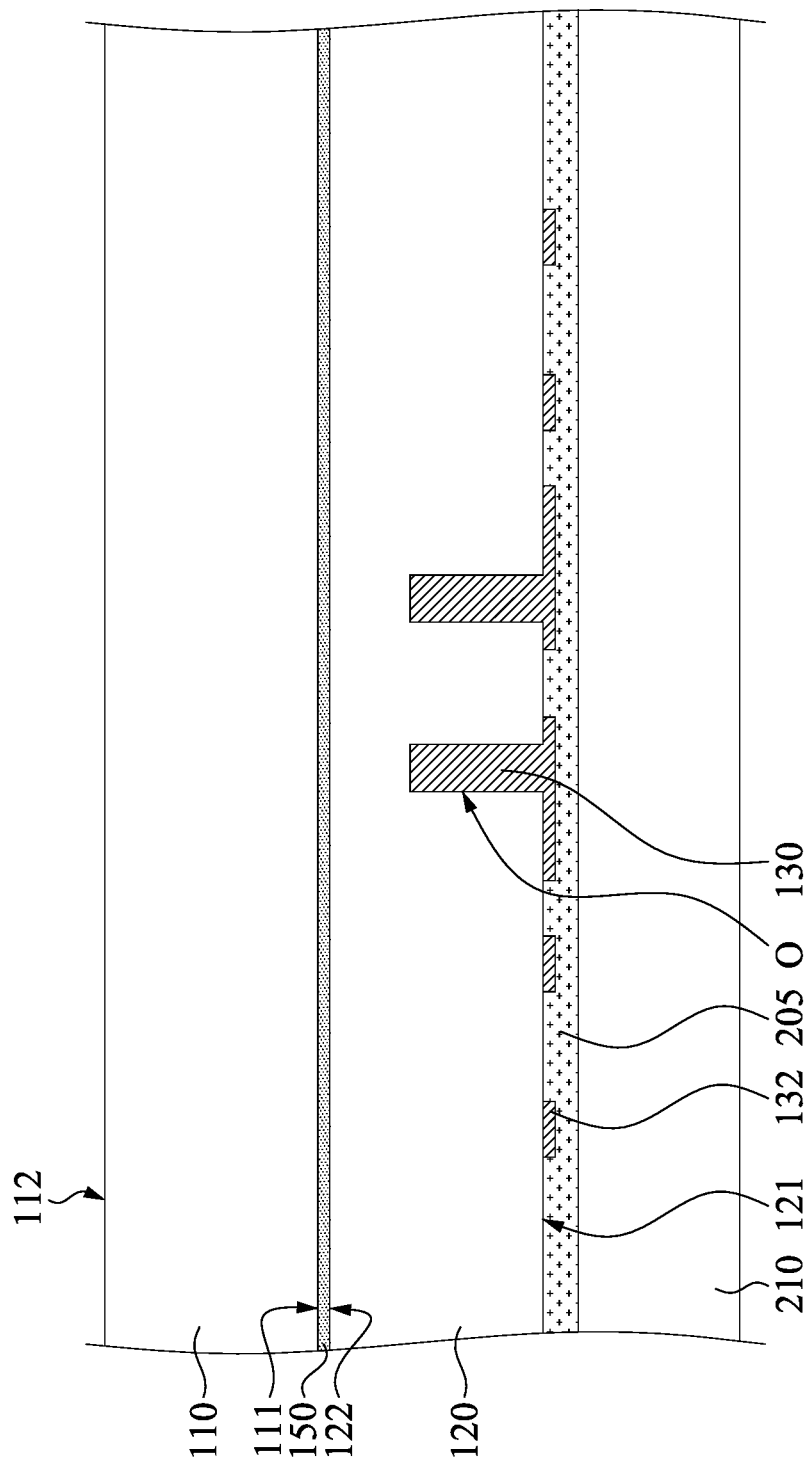
FIG. 5 is a cross-sectional view of the second substrate shown in FIG. 4 after bonding to the carrier.

FIG. 5 is a cross-sectional view of the second substrate 120 of FIG. 4 after bonding to a carrier 210. As shown in FIG. 4 and FIG. 5, after the conductive via 130 is formed, the structure of FIG. 4 can be turned 180 degrees, and the second substrate 120 may be bonded to the carrier 210 through a temporary bonding layer 205. The carrier 210 may be used to provide support in a subsequent manufacturing process. The adhesion of the temporary bonding layer 205 may be removed by illumination, soaking or high temperature processes. It is noted that the manufacturing method is not limited to the method above. In other embodiments, the step of bonding the carrier 210 can be omitted if the first substrate 110 and the second substrate 120 are sufficiently thick.

Figure 6:
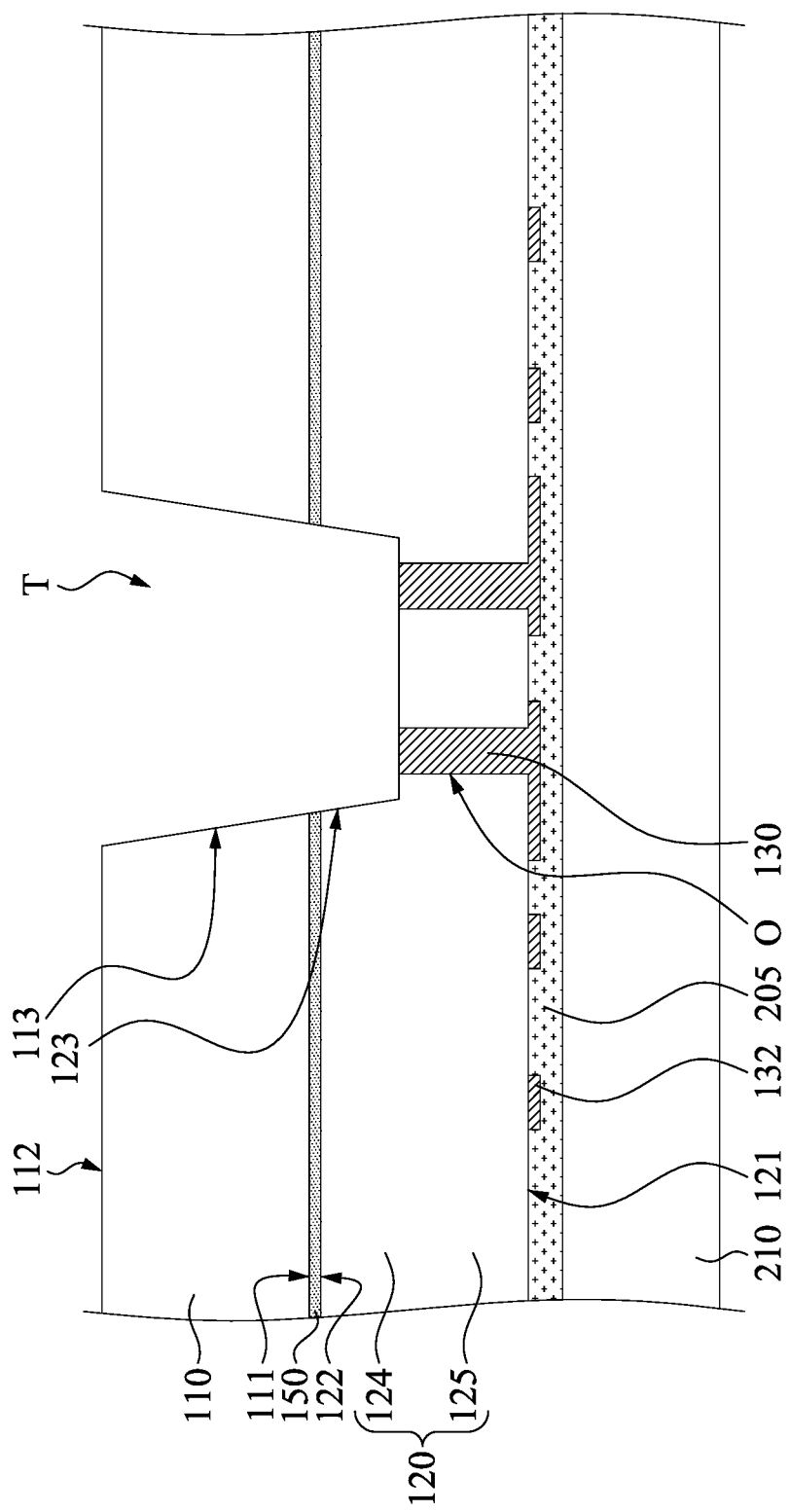
FIG. 6 is a cross-sectional view of the first substrate and the second substrate shown in FIG. 5 after forming a trench.

FIG. 6 is a cross-sectional view of the first substrate 110 and the second substrate 120 of FIG. 5 after forming a trench T. After bonding to the carrier 210, the trench T may be formed in the first substrate 110 and the second substrate 120, such that the conductive via 130 is exposed through the trench T. After forming the trench T, the first substrate 110 has the first inclined sidewall 113, and the second substrate 120 has the second inclined sidewall 123, wherein the slope of the first inclined sidewall 113 is substantially equal to the slope of the second inclined sidewall 123. In this embodiment, the trench T is formed by cutting the first substrate 110 and the second substrate 120 with a cutting tool. The trench T may also be formed by etching.

Figure 7:
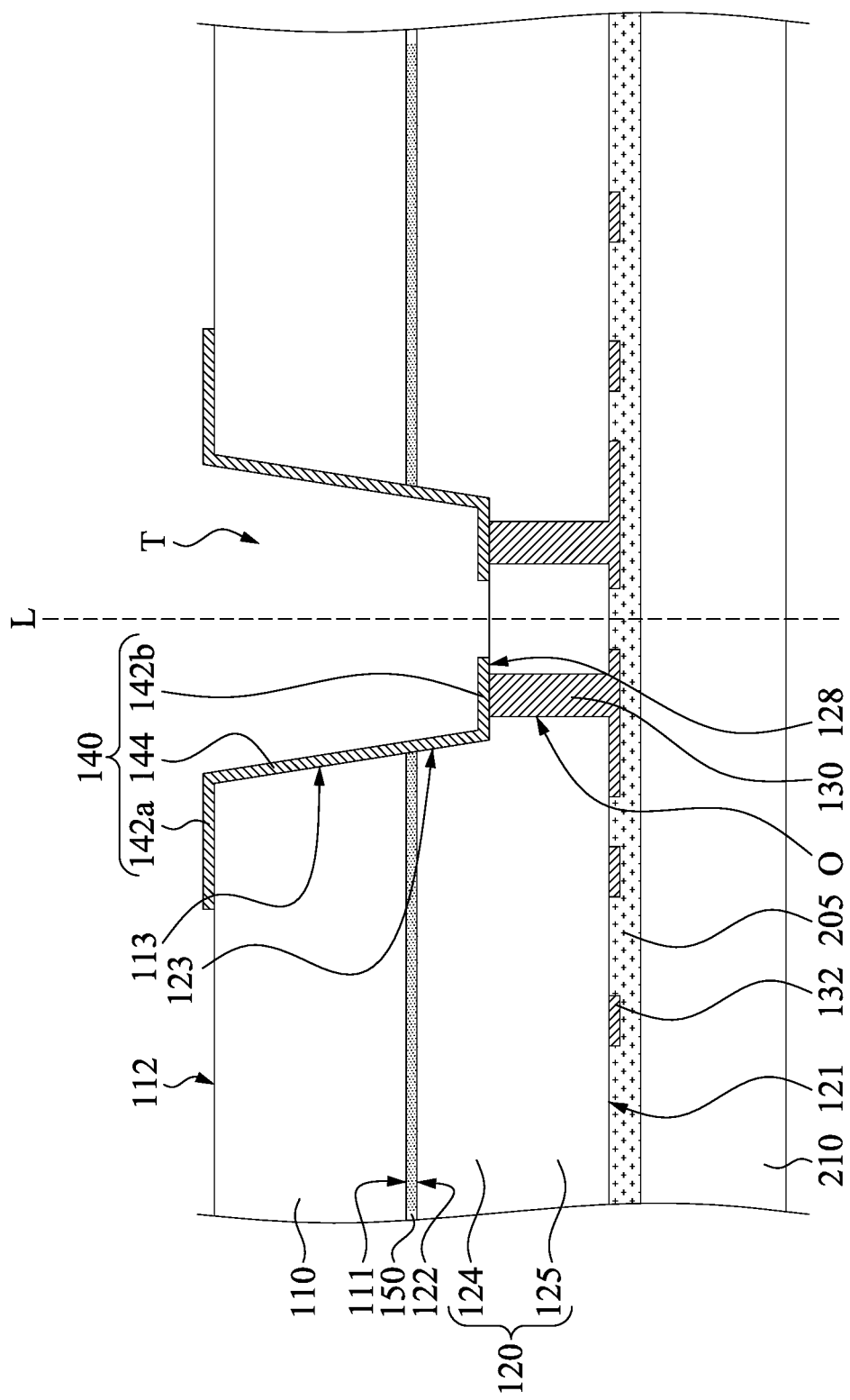
FIG. 7 is a cross-sectional view of the first substrate and the second substrate shown in FIG. 6 after forming a redistribution layer on the first substrate and the second substrate.

FIG. 7 is a cross-sectional view of the first substrate 110 and the second substrate 120 of the FIG. 6 after forming the redistribution layer 140. Thereafter, the redistribution layer 140 that has the horizontal portions 142a, 142b and the inclined portion 144 may be formed, and extends from the top surface 112 of the first substrate 110 to the top surface 128 of the lower portion 125 of the second substrate 120 sequentially along the first inclined sidewall 113 and the second inclined sidewall 123, such that the redistribution layer 140 can be electrically connected to the conductive via 130. The conductive via 130 is only located in the lower portion 125 of the second substrate 120 and the aspect ratio of the conductive via 130 can be lowered effectively. Moreover, the redistribution layer 140 extends from the first inclined sidewall 113 and the second inclined sidewall 123 so that the thickness of the first substrate 110 and the second substrate 120 do not affect the aspect ratio, and this also benefits design.

Figure 8:
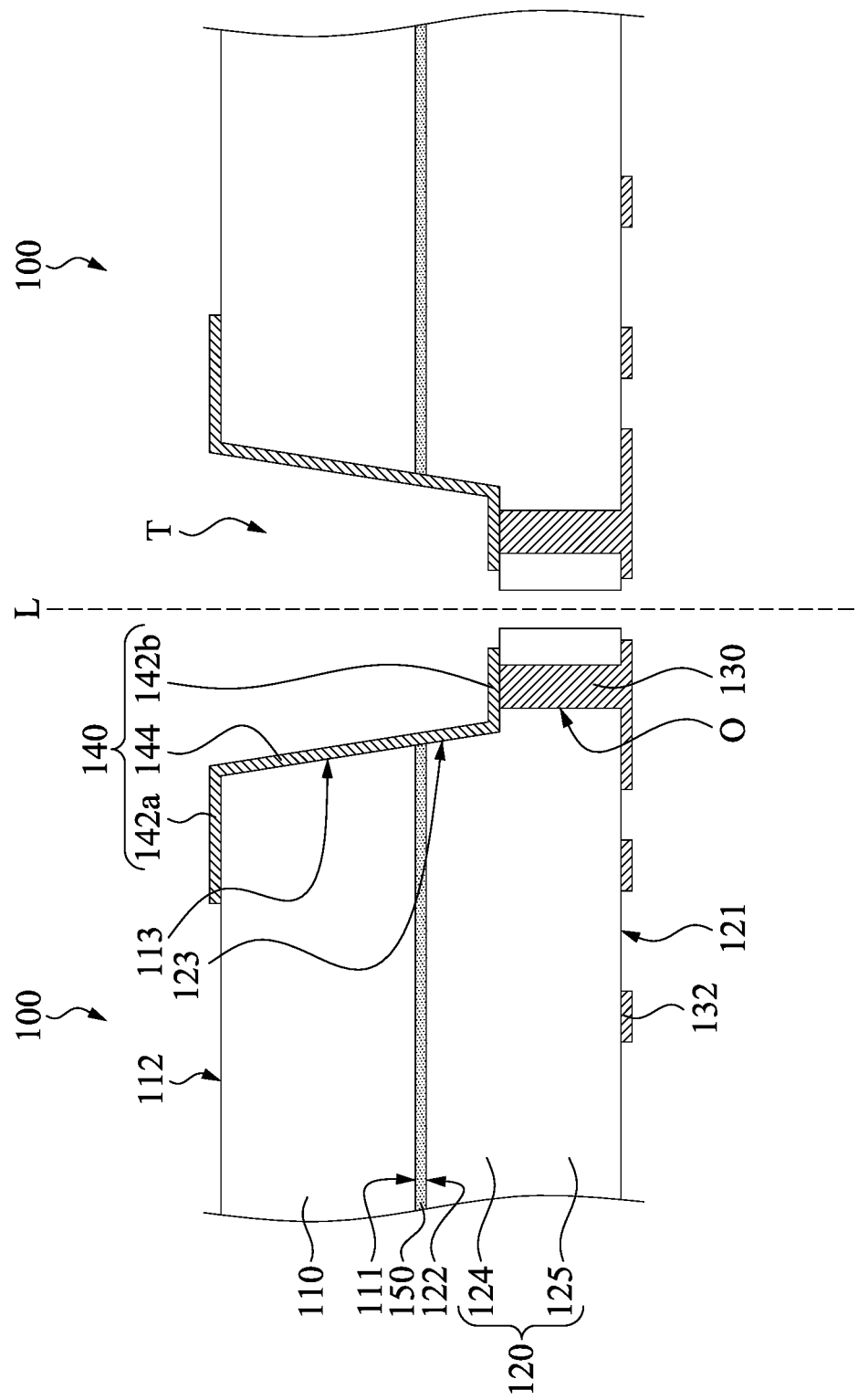
FIG. 8 is a cross-sectional view of the second substrate shown in FIG. 7 after being cut.

FIG. 8 is a cross-sectional view of the second substrate 120 of FIG. 7 after cutting. As shown in FIG. 7 and FIG. 8, after the formation of the redistribution layer 140, the carrier 210 and the temporary bonding layer 205 may be removed from the bottom surface 121 of the second substrate 120. Thereafter, a plurality of chip structures 100 can be obtained by cutting along the trench T (i.e., cutting along a line L). Moreover, a shape of a sidewall of the second substrate 120 may be vertical (as shown in FIG. 8) or stepped (for example, the lower portion 125 may also have the structure of the inclined sidewall 123) depending on a required cutting depth of the second substrate 120. The detailed structure of the chip structure 100 can be seen in FIG. 1, and a description thereof will not be repeated.

Figure 9:
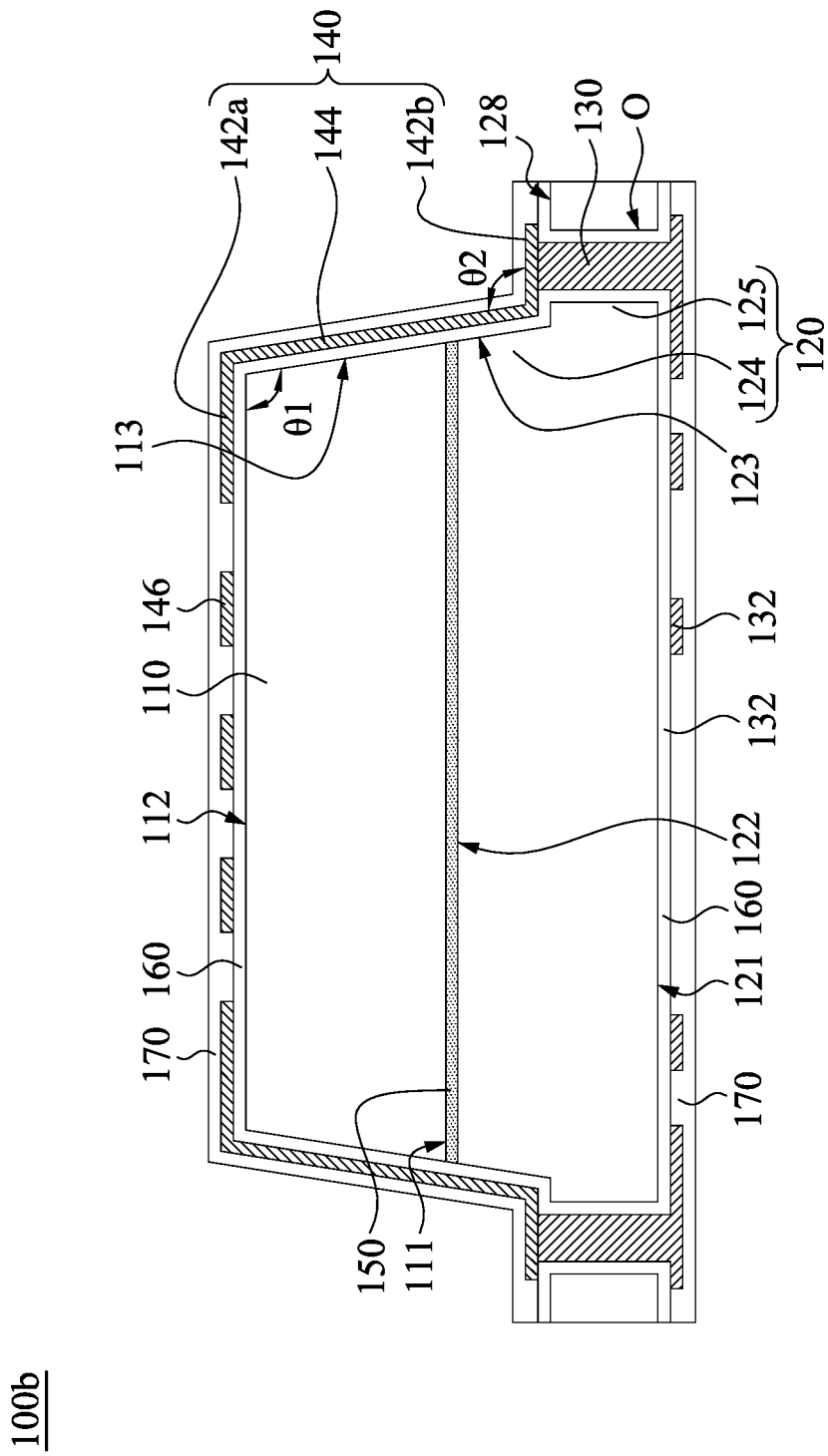
FIG. 9 is a cross-sectional view of a chip structure according to one embodiment of the present invention.

FIG. 9 is a cross-sectional view of the chip structure 100b according to one embodiment of the present invention. The chip structure 100b includes a first substrate 110, a second substrate 120, a conductive via 130, and a redistribution layer 140. The difference from the embodiment of FIG. 1 is that the chip structure 100b of this embodiment further includes an isolation layer 160 and a surface protecting layer 170. The isolation layer 160 is located between the conductive via 130 and the second substrate 120, on the bottom surface 121 of the second substrate 120, between the redistribution layer 140 and the first substrate 110, on the top surface 112 of the first substrate 110, on the first inclined sidewall 113, on the inclined lateral surface of the bonding layer 150, on the second inclined sidewall 123, and on the lower portion 125 of the second substrate 120. In this embodiment, the surface protecting layer 170 covers isolation layer 160.

A determination of whether the isolation layer 160 is needed is made based on the conductivity of the material of the first substrate 110 and the second substrate 120. For example, the chip structure 100 in FIG. 1 does not need the isolation layer 160. Moreover, a determination of whether the surface protecting layer 170 is needed is made based on the subsequent packaging method and the protection needs of the wiring (e.g., the redistribution layer 140). For example, the chip structure 100 in FIG. 1 does not need the surface protecting layer 170.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing form the scope or spirit of the invention. In view of the foregoing, it is intended that the present invention covers modifications and variations of this invention provided they fall within the scope of the following claims.

What is claimed is:

1. A chip structure, comprising:
   a first substrate having a first inclined sidewall;
   a second substrate located on a lower surface of the first substrate, and having an upper portion and a lower portion, wherein the lower portion extends from the upper portion, and the upper portion is between the first substrate and the lower portion and has a second inclined sidewall;
   a bonding layer between the first substrate and the second substrate, wherein the first inclined sidewall of the first substrate, an inclined lateral surface of the bonding layer, and the second inclined sidewall of the upper portion of the second substrate have a same slope;
   a conductive via in the lower portion; and
   a redistribution layer extending from a top surface of the first substrate to a top surface of the lower portion of the second substrate sequentially along the first inclined sidewall and the second inclined sidewall, and electrically connected to the conductive via.

2. The chip structure of claim 1, wherein the inclined lateral surface of the bonding layer is in contact with the redistribution layer.

3. The chip structure of claim 1, wherein the chip structure further comprises:
   an isolation layer located between the conductive via and the second substrate, on a lower surface of the second substrate, between the redistribution layer and the first substrate, on the top surface of the first substrate, on the first inclined sidewall, on the inclined lateral surface of the bonding layer, and on the second inclined sidewall.

4. The chip structure of claim 1, wherein the chip structure further comprises:
   a surface protecting layer located on the top surface of the first substrate, the redistribution layer, the first inclined sidewall, the inclined lateral surface of the bonding layer, the second inclined sidewall, and the lower portion of the second substrate.

5. The chip structure of claim 1, wherein the first substrate has a conductive pad, and a sidewall of the conductive pad is in contact with the redistribution layer.

6. The chip structure of claim 5, wherein the conductive pad of the first substrate is located on the bonding layer.

7. The chip structure of claim 1, wherein the second substrate has a conductive pad, and a sidewall of the conductive pad is in contact with the redistribution layer.

8. The chip structure of claim 7, wherein the bonding layer is located on the conductive pad of the second substrate.

9. The chip structure of claim 1, wherein each of the first substrate and the second substrate has a conductive pad, and the bonding layer is located among the two conductive pads and the redistribution layer.

10. The chip structure of claim 1, wherein the redistribution layer is stepped.

11. The chip structure of claim 1, wherein the redistribution layer has two horizontal portions and an inclined portion, and two ends of the inclined portion are respectively connected to the two horizontal portions.

12. The chip structure of claim 11, wherein the two horizontal portions of the redistribution layer are respectively located on the top surface of the first substrate and the top surface of the lower portion, and the inclined portion is located on the first inclined sidewall, the inclined lateral surface of the bonding layer, and the second inclined sidewall.

13. The chip structure of claim 11, wherein the horizontal portion located on the top surface of the lower portion is in contact with a top surface of the conductive via.

14. A manufacturing method of a chip structure, comprising:
   bonding, by a bonding layer, a first substrate to a second substrate, wherein the bonding layer is between the first substrate and the second substrate;
   forming an opening in the second substrate;
   forming a conductive via in the opening of the second substrate;
   forming a trench in the first substrate and second substrate such that the conductive via is exposed through the trench, wherein the first substrate has a first inclined sidewall, the bonding layer has an inclined lateral surface, and the first inclined sidewall of the first substrate, the inclined lateral surface of the bonding layer, and a second inclined sidewall of the second substrate have a same slope; and forming a redistribution layer that extends from a top surface of the first substrate to a top surface of a lower portion of the second substrate sequentially along the first inclined sidewall, the inclined lateral surface, and the second inclined sidewall, and is electrically connected to the conductive via.

15. The manufacturing method of the chip structure of claim 14, wherein the conductive via is formed by electroplating or electroless plating.

16. The manufacturing method of the chip structure of claim 14, further comprising:
    after forming the conductive via, bonding the second substrate to a carrier.

17. The manufacturing method of the chip structure of claim 16, further comprising:
    after forming the redistribution layer, removing the carrier from the second substrate.

18. The manufacturing method of the chip structure of claim 14, wherein the trench is formed by cutting the first substrate and the second substrate with a cutting tool.

19. The manufacturing method of the chip structure of claim 14, further comprising:
    after forming the redistribution layer, cutting the second substrate along the trench, wherein a shape of a sidewall of the second substrate is upright or stepped based on a cutting depth of the second substrate.

* * * * *